(12) United States Patent
Iihola et al.

(10) Patent No.: US 9,425,158 B2
(45) Date of Patent: Aug. 23, 2016

(54) RIGID-FLEX MODULE AND MANUFACTURING METHOD

(75) Inventors: Antti Iihola, Helsinki (FI); Tuomas Waris, Helsinki (FI)

(73) Assignee: GE Embedded Electronics Oy, Helsinki (FI)

( * ) Notice: Subject to any disclaimer, the term of this patent is extended or adjusted under 35 U.S.C. 154(b) by 433 days.

(21) Appl. No.: 12/652,399

(22) Filed: Jan. 5, 2010

(65) Prior Publication Data
US 2010/0170703 A1    Jul. 8, 2010

(30) Foreign Application Priority Data
Jan. 5, 2009  (FI) ..................... 20095005

(51) Int. Cl.
  *H05K 1/00*  (2006.01)
  *H01L 23/00*  (2006.01)
  (Continued)

(52) U.S. Cl.
  CPC ............. *H01L 24/18* (2013.01); *H01L 24/82* (2013.01); *H05K 1/188* (2013.01); *H05K 3/4691* (2013.01); *H01L 2224/18* (2013.01); *H01L 2224/2919* (2013.01); *H01L 2224/32245* (2013.01); *H01L 2224/83005* (2013.01); *H01L 2224/83192* (2013.01); *H01L 2224/92144* (2013.01); *H01L 2924/01002* (2013.01); *H01L 2924/01005* (2013.01); *H01L 2924/01006* (2013.01); *H01L 2924/01011* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01047* (2013.01); *H01L 2924/01061* (2013.01); *H01L 2924/01078* (2013.01); *H01L 2924/01079* (2013.01); *H01L 2924/01082* (2013.01); *H01L 2924/12041* (2013.01); *H01L 2924/12042* (2013.01); *H01L 2924/14* (2013.01);
(Continued)

(58) Field of Classification Search
  CPC ..... H05K 1/00; H05K 1/0277; H05K 1/0278; H05K 1/028; H05K 1/0283; H05K 1/038; H05K 3/4691; H05K 1/18; H05K 1/185; H05K 1/189; H01L 27/00
  USPC ......................................... 174/254
  See application file for complete search history.

(56) References Cited

U.S. PATENT DOCUMENTS 5,144,534 A    9/1992  Kober
7,663,215 B2   2/2010  Tuominen et al.
(Continued)

FOREIGN PATENT DOCUMENTS

CN    1853451 A    8/2006
CN    101297610 A    8/2008
(Continued)

*Primary Examiner* — Tremesha S Willis
(74) *Attorney, Agent, or Firm* — Seppo Laine Oy

(57) ABSTRACT

Rigid-flex-type circuit-board structure and manufacturing method, in which a flexible membrane (20) and a sacrificial-material piece (16) are attached to an insulator membrane (12) in the location of the flexible zone (13). An insulator layer (1), which encloses within itself a sacrificial-material piece (16) is manufactured on the surface of the conductor membrane (12). The flexible zone (13) is formed in such a way that an opening (9) is made in the insulator layer (1), through which the sacrificial-material piece (16) is removed. The flexible zone comprises at least part of the flexible membrane (20) as well as conductors (22), which are manufactured by patterning the insulator membrane (12) at a suitable stage in the method.

10 Claims, 15 Drawing Sheets

(51) Int. Cl.
*H05K 1/18* (2006.01)
*H05K 3/46* (2006.01)

(52) U.S. Cl.
CPC . *H01L 2924/1433* (2013.01); *H01L 2924/1461* (2013.01); *H01L 2924/181* (2013.01); *H05K 2201/0187* (2013.01); *H05K 2201/0355* (2013.01); *H05K 2201/09127* (2013.01); *H05K 2203/308* (2013.01)

(56) References Cited

U.S. PATENT DOCUMENTS

| | | |
|---|---|---|
| 2004/0070959 A1 | 4/2004 | Sakai |
| 2005/0092519 A1 | 5/2005 | Beauchamp |
| 2007/0025092 A1 | 2/2007 | Lee et al. |
| 2007/0205479 A1 | 9/2007 | Dangel et al. |
| 2007/0267136 A1 | 11/2007 | Tuominen et al. |
| 2008/0009096 A1 | 1/2008 | Hwang |
| 2008/0014768 A1 | 1/2008 | Lee et al. |
| 2008/0047737 A1 | 2/2008 | Sahara et al. |
| 2008/0128886 A1 | 6/2008 | Kang et al. |
| 2008/0149372 A1 | 6/2008 | Choi et al. |
| 2008/0196930 A1 | 8/2008 | Tuominen et al. |
| 2008/0261388 A1 | 10/2008 | Ilhola et al. |
| 2009/0026168 A1 | 1/2009 | Tsai |
| 2009/0154132 A1* | 6/2009 | Okamoto et al. ............ 361/804 |

FOREIGN PATENT DOCUMENTS

| | | |
|---|---|---|
| CN | 101233351 A | 10/2008 |
| DE | 102004057505 A1 | 6/2006 |
| GB | 2294363 | 4/1996 |
| JP | 2001308540 A | 11/2001 |
| JP | 2006140213 A | 6/2006 |
| JP | 2007506273 A | 3/2007 |
| JP | 2008034588 A | 2/2008 |
| WO | WO2005027602 A1 | 3/2005 |
| WO | WO2007013595 A1 | 2/2007 |
| WO | WO 2007107630 A1 | 9/2007 |
| WO | WO2008/027396 A1 | 3/2008 |
| WO | WO2008098269 A1 | 8/2008 |

* cited by examiner

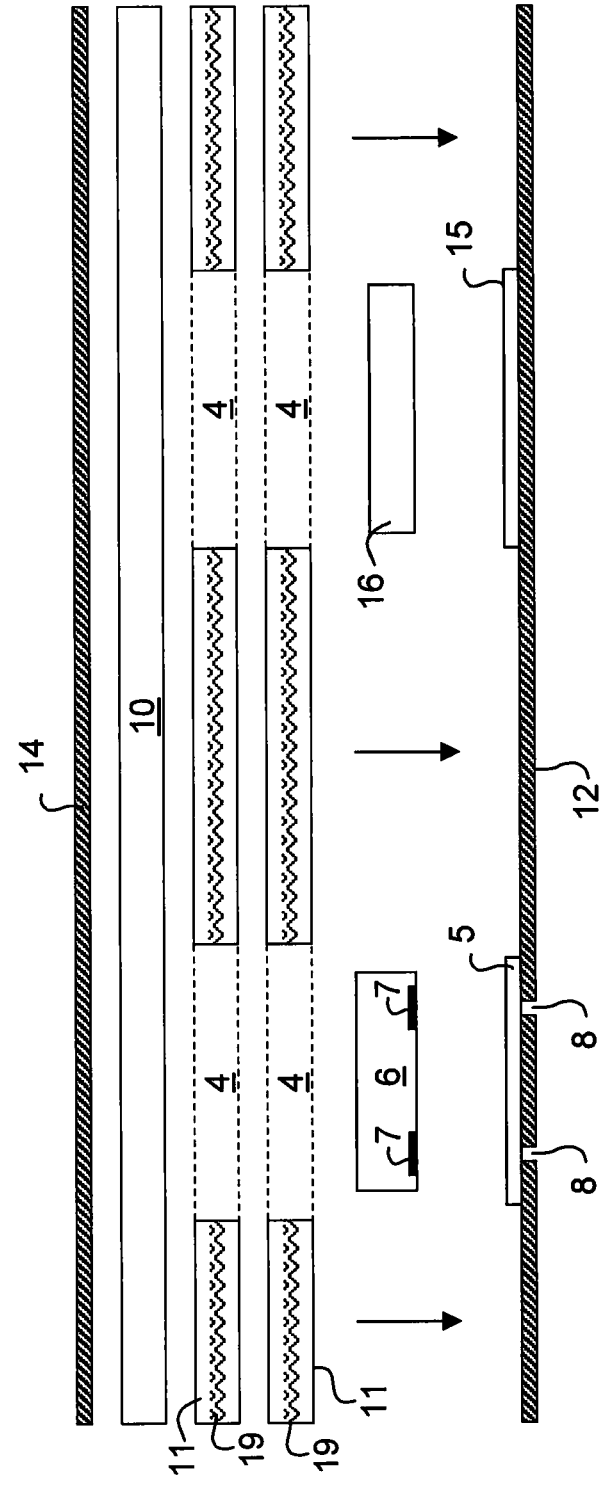

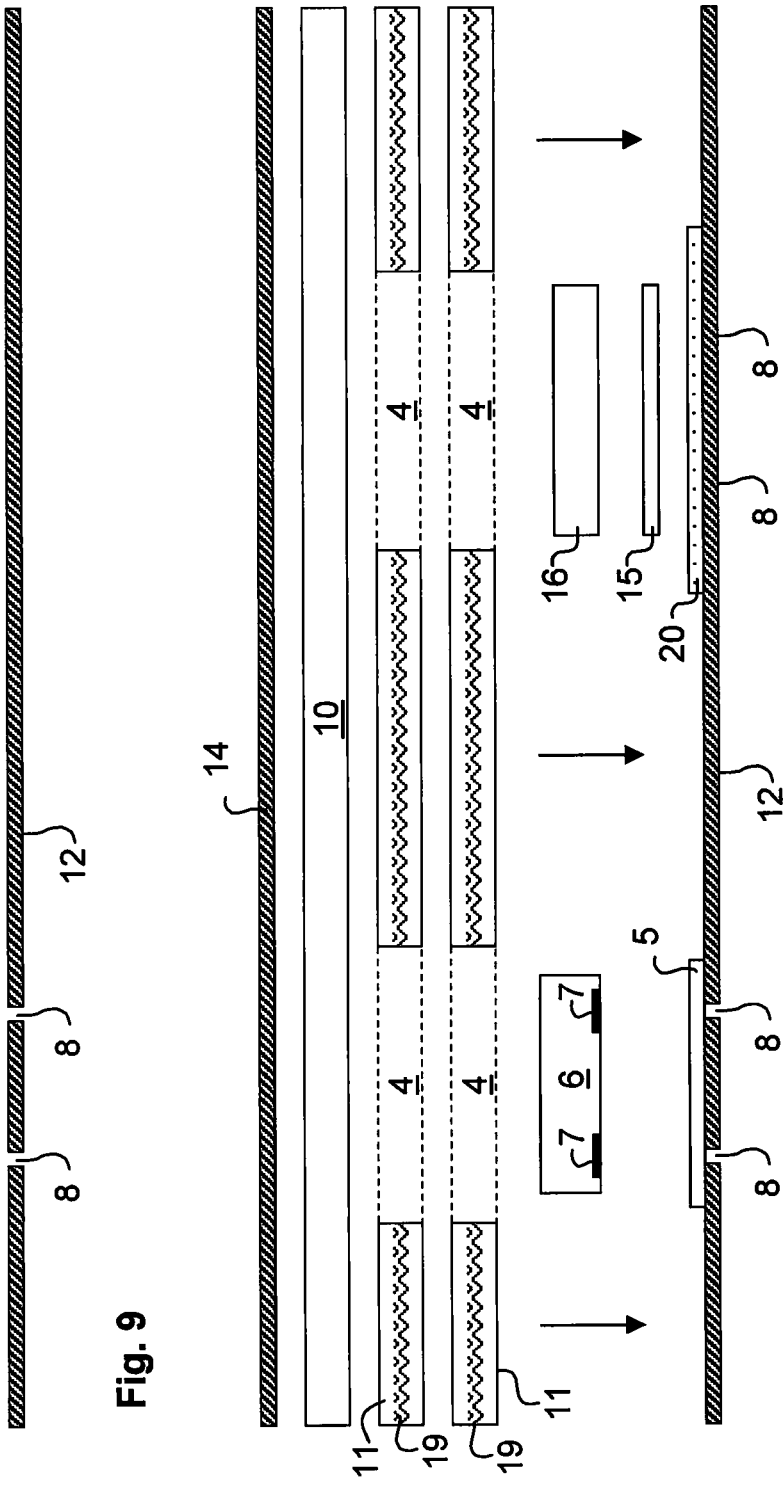

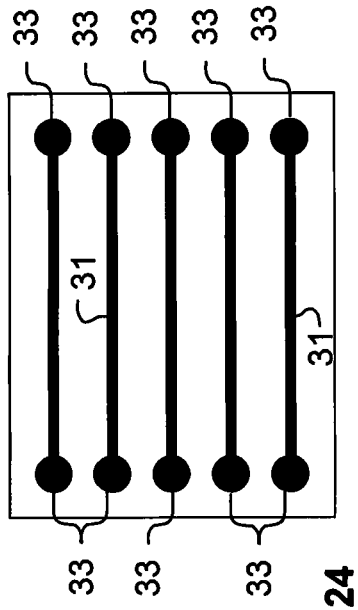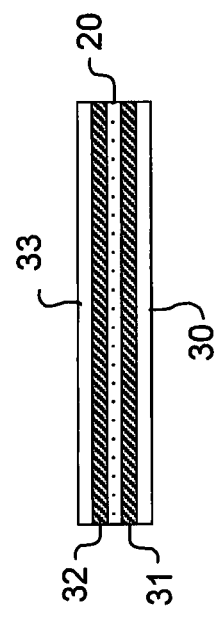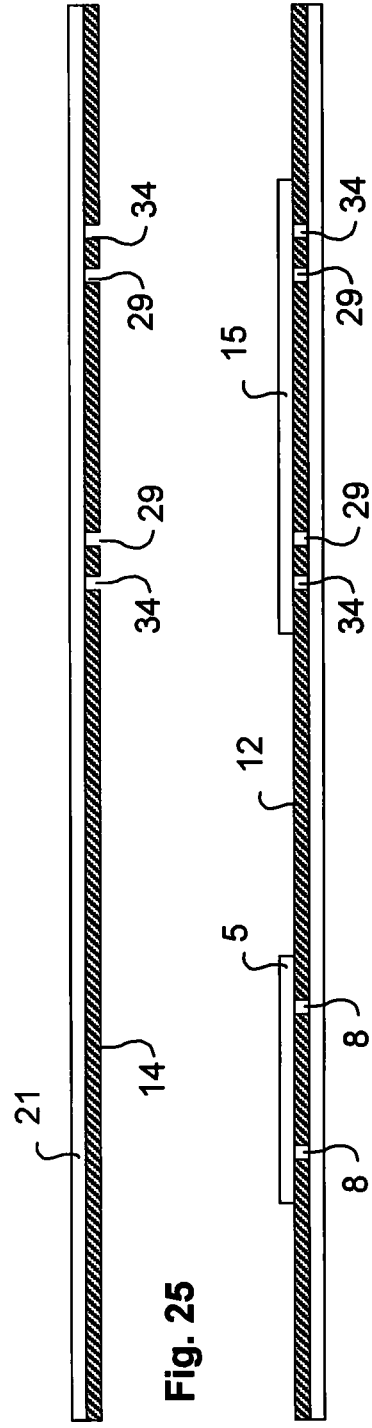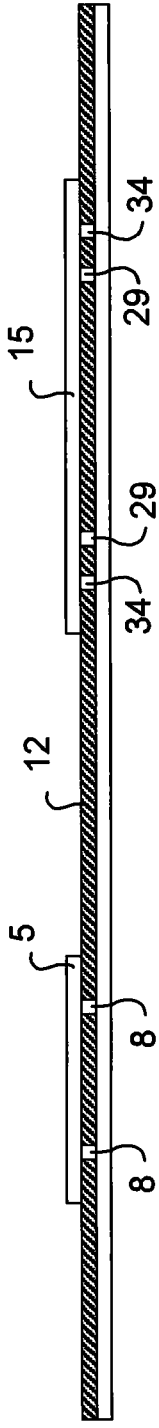
Fig. 23
Fig. 24
Fig. 25
Fig. 26

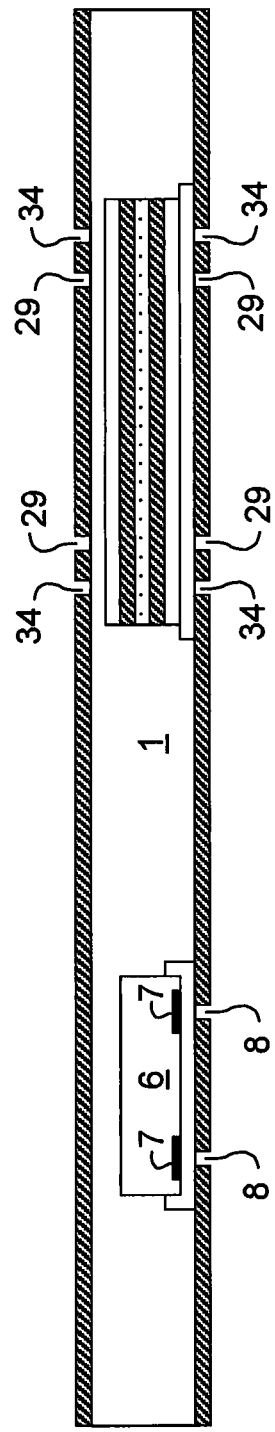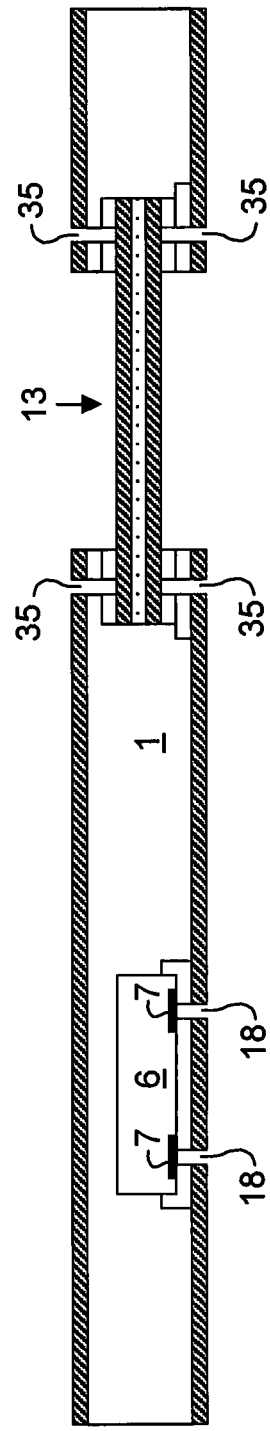

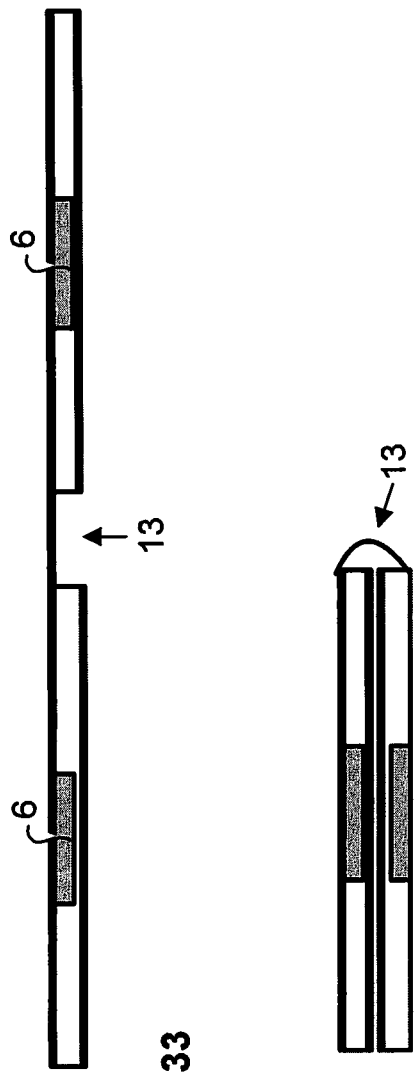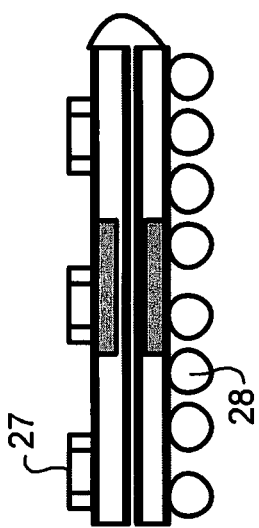
Fig. 33
Fig. 34
Fig. 35

RIGID-FLEX MODULE AND MANUFACTURING METHOD

TECHNICAL FIELD

The invention relates to rigid-flex-type circuit boards and electronics modules. A rigid-flex-type circuit board comprises at least one flexible zone (flex) and at least one stiffer (rigid) zone. The term electronic module, for its part, refers to a circuit board or some other corresponding structure, which comprises at least one component inside an insulator layer.

The invention also relates to a method for manufacturing the aforementioned circuit boards. The circuit board can be, for example, a one or multi-layer circuit board, an electronic module, or some other corresponding structure.

BACKGROUND ART

Rigid-flex-type circuit boards are disclosed in patent-application publication US 2008/0014768 A1.

Rigid-flex-type circuit boards, on the surface of which components are attached using the surface-mounting technique, are disclosed in patent-application publication US 2008/0149372 A1. After this, the circuit board is folded at the flexible zone, thus forming a memory-circuit module containing components on top of each other.

Rigid-flex-type circuit boards and electronics modules are disclosed in patent-application publication US 2008/0009096 A1.

Rigid-flex-type circuit boards and electronics modules are disclosed in patent-application publication US 2008/128886 A1.

DISCLOSURE OF INVENTION

The object of the present invention is to develop a new manufacturing method for manufacturing circuit boards comprising a flexible zone.

According to one aspect of the invention, a manufacturing method is created, in which a flexible membrane and a piece of sacrificial material are attached to a conductor membrane in a flexible zone. An insulator layer is manufactured on the surface of the conductor membrane, which encloses the piece of sacrificial material. The flexible zone is formed in such a way that an opening, through which the piece of sacrificial material is removed, is made in the insulator layer. The flexible zone comprises at least part of the flexible membrane and conductors, which are made by patterning the conductor membrane at a suitable stage of the method.

With the aid of such a method, many different types of circuit boards can be manufactured. With the aid of the method, it is also possible to manufacture demanding circuit board structures, such as multi-chip packages and other electronic modules. According to another aspect of the invention, a rigid-flex-type electronic module is created, which comprises at least one flexible zone. The electronic module comprises at least one layer of conductors, which run over the flexible zone, supported by the flexible membrane. Outside the flexible zone, the electronics module comprises an insulator layer, which also supports the said conductors. Inside the insulator layer is at least one component, the contact terminals on the surface of which face towards the said conductors and are connected to them by means of the contact elements. It is possible to manufacture an electronics module in such a way that the contact elements are unified metal pieces, consisting of one or more metal layers, each of which is manufactured by growing using a chemical or electro-chemical method.

Thus, a new type of manufacturing method is created for making new types of electronics modules, which can provide some advantages in some applications.

According to one embodiment, it is possible to manufacture a very simple and low-cost rigid-flex type electronics module, which, however, provides high-quality electrical contacts to one or more components located inside the electronics module.

In embodiments, it is also possible to achieve a higher packaging density when manufacturing rigid-flex-type packages. This is because contacts in the Z-direction between the conductor layers need not necessarily be made in the package with the aid of through holes. This makes it possible to achieve a small XY-direction surface area for the package, or more conductors can fitted into a given area. Correspondingly, it also becomes possible to embed in the package a component, or components with a higher connection density.

With the aid of embodiments, it is also possible to shorten the manufacturing process for multi-layer packages.

BRIEF DESCRIPTION OF DRAWINGS

FIG. 1 shows one intermediate stage in the manufacturing method according to a first embodiment.

FIG. 2 shows a second intermediate stage in the manufacturing method according to a first embodiment.

FIG. 9 shows one intermediate stage in the manufacturing method according to a second embodiment.

FIG. 10 shows a second intermediate stage in the manufacturing method according to a second embodiment.

FIG. 23 shows a side view of a flex piece, which is used in the manufacturing method according to a fourth embodiment.

FIG. 24 shows a top view of the flex piece of FIG. 23.

FIG. 25 shows a side view of one membrane structure, which is used in the manufacturing method according to a fourth embodiment.

FIG. 26 shows a side view of a second membrane structure, which is used in the manufacturing method according to a fourth embodiment.

FIG. 29 shows a third intermediate stage in the manufacturing method according to a fourth embodiment.

FIG. 30 shows a fourth intermediate stage in the manufacturing method according to a fourth embodiment.

FIG. 33 shows one intermediate stage in the method according to the third embodiment, by means of which a package is manufactured, for example, from the product depicted in FIG. 8 or 15.

FIG. 34 shows a second intermediate stage in the method according to the third embodiment.

FIG. 35 shows one possible end product in the method according to the third embodiment.

MODES FOR CARRYING OUT THE INVENTION

Figure 3:
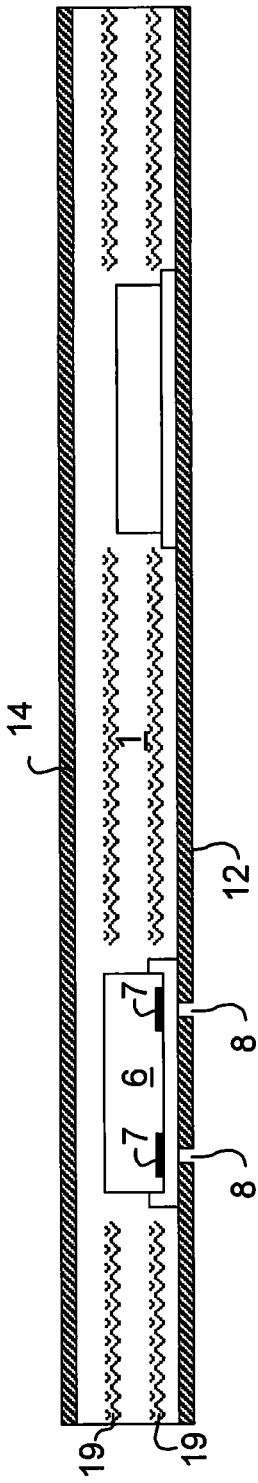
FIG. 3 shows a third intermediate stage in the manufacturing method according to a first embodiment.

FIGS. 1-8 show the manufacturing method according to one embodiment. In this embodiment, manufacture begins from a conductor membrane 12, which is, for example, metal. A suitable conductor membrane 12 is, for example, a copper film, the thickness of which is in the range 1-70 µm, typically in the range 3-12 µm.

Instead of a bare conductor membrane 12, a layered membrane, which comprises a conductor membrane 12 and an insulator layer on the surface of this, can also be used as the starting material. If the insulator layer is on the upper surface of the conductor membrane 12, in accordance with the positioning in FIGS. 1 and 2, it can be used, for example, to improve adhesion between the conductor membrane 12 and the adhesive and insulator layers manufactured later on top of this. In that case, there is reason for the insulator layer to be thin. An adhesive layer can also be used to support the conductor membrane 12 from the under surface (according to the positioning in FIGS. 1 and 2) and can, if necessary, be removed from the structure at a later stage in the manufacturing method.

One practicable layer-membrane alternative is a two-layer copper film, in which a second copper film, which supports the structure in the initial stage of the manufacturing method, is detachably attached under (according to the positioning in FIGS. 1 and 2) the copper film forming the conductor membrane 12. The support membrane can thus also be of a conductive material.

It is also possible to proceed in such a way that manufacture is started from a support membrane supporting the conductor membrane 12 and manufacturing a conductor membrane 12 on the surface of this. Instead of the conductor membrane 12, it is also possible to manufacture only a conductor pattern directly on the support membrane.

In the embodiments described hereinafter, it is also possible to use the layered membranes referred to above instead of a conductor membrane 12.

Next, contact openings 8 are made in the conductor membrane 12, which are located on the conductor membrane 12 in such a way that they coincide with the contact terminals of the components to be placed in the module being manufactured. Thus, an individual contact opening 8 is made in the conductor membrane 12 for the contact terminals of each component. In this embodiment, the contact openings 8 are manufactured with the aid of a UV laser. The contact openings 8 can also be manufactured, for example, using some other laser technique, by mechanical drilling, by milling, or by etching.

In the embodiment of FIG. 1, the contact openings 8 are manufactured in such a way that the size of a contact opening 8 is less than the contact surface area of the contact terminal situated at the position of the contact opening 8. The shape of the contact opening is typically circular, but other shapes can also be used. The shape and size of the contact opening 8 are selected in such a way that the contact surface of the contact terminal is able to cover the contact opening 8 entirely.

According to FIG. 2, manufacture is continued by spreading an adhesive layer 5 on the surface of the conductor membrane 12, in the attachment area of the component. Thus, the adhesive layer 5 also covers the contact openings 8. Alternatively, the adhesive 5 can be spread on the surface of the component. The adhesive can also be spread on the surfaces of both the component and the conductor membrane 12. Typically, the adhesive is spread locally, so that the adhesive layer 5 will be located only in the attachment area of the component. An adhesive that does not conduct electricity is used to glue the component.

The term adhesive refers to a material, by means of which components can be attached to the conductor membrane 12 that acts as the substrate. One property of the adhesive is that it can be spread on the surface to be glued in a relatively fluid form, or otherwise in a form that adapts to the surface shapes, for example, as a membrane. A second property of the adhesive is that, after spreading, the adhesive hardens, or can be hardened, at least partly, in such a way that the adhesive will be able to hold the component in place (relative to the conductor membrane 12), at least until the component can be secured to the structure in some other way. A third property of the adhesive is adhesive capability, i.e. an ability to adhere to the surfaces being glued.

For its part, the term gluing refers to joining the pieces to be glued together with the aid of an adhesive. In the embodiments, the adhesive is brought between the component and the conductor membrane 12 that acts as the substrate and the component is placed in a suitable position relative to the substrate, in which the adhesive is in contact with the component and the substrate and at least partly fills the space between the component and the substrate. After this, the adhesive is allowed (at least partly) to harden, or the adhesive is actively hardened (at least partly), so that the component is attached to the substrate with the aid of the adhesive. In some embodiments, the contact protrusions of the component may penetrate through the adhesive layer during gluing, to come into contact with the substrate.

The adhesive used in the embodiments is typically an epoxy-based adhesive, for example, a thermally hardening epoxy adhesive. The adhesive is selected in such a way that the adhesive being used will have sufficient adhesion to the substrate and the component. One preferred property of the adhesive is a suitable coefficient of thermal expansion, so that the thermal expansion of the adhesive will not differ excessively from the thermal expansion of the surrounding material during the process. It would also be preferable for the adhesive selected to have a short hardening time, preferably of a few seconds. Within this time, it would be good if the adhesive would harden at least partly as much as to allow the adhesive to be able to hold the component in place. The final hardening could take clearly longer and the final hardening could even be designed to take place in connection with later process stages. In addition, when selecting the adhesive, allowance is made for the stress, such as thermal, chemical, or mechanical stress, caused by the later stages of the manufacturing process.

An adhesive layer 15 for the gluing of the sacrificial material is spread in a fully corresponding manner on the surface of the conductor layer in essentially the same stage as the adhesive layer 5 is spread for the components. In the adhesive layer 15, it is preferable to use an adhesive, which loses its adhesion and/or cohesion, for example, due to the effect of heat treatment (a so-called thermal-release adhesive). Other possible adhesives that can be used in the adhesive layer 15 are adhesives, the adhesion or cohesion of which can be weakened, for example, by chemical treatment, physical processing, or with the aid of ultraviolet radiation.

Next, a component 6, which comprises contact terminals 7, is taken. The component 6 is, for example, a semiconductor component, for example a processor, memory chip, or other microcircuit. The contact terminals 7 of the component 6 shown in FIG. 1 are contact areas, which are located essentially on the plane of the surface of the component. Such contact areas of the component 6 are formed in the semiconductor component manufacturing process at a semiconductor factory. The surface of a conductor pattern of the metal used in the process is typically formed in the contact area. The metal used in semiconductor component manufacturing process is usually aluminium, though other metals, metal allows, or other conductor materials can also be used. For example, the use of copper has become widespread in semiconductor component manufacturing processes. The contact terminals 7 of the component 6 can also be contact bumps, which protrude from the plane of the surface of the component. Such contact bumps are manufactured in a bump-forming process, after the manufacture of the semiconductor component, typically in a separate factory. A contact bump can contain one or more metals, metal alloys, or other conductor materials. Typically, the outer surface of the contact bump, i.e. the contact surface, is made from copper or gold.

The component 6 is aligned relative to the contact openings 8, in such a way that each contact terminal 7 coincides with the corresponding contact opening 8, and is pressed against the adhesive layer 5. After this, the adhesive is at least partly hardened, so that relative movement of the component 6 and the conductor membrane 12 can be prevented or minimized after alignment. In alignment and gluing, positioning is sought, in which the contact opening 8 will be in the centre of the corresponding contact terminal 7.

A piece 16 of sacrificial material is attached to the conductor membrane in essentially the same stage and in essentially the same manner as the component 6. The sacrificial material can be, for example, polytetrafluoroethylene, such as Teflon®. Some other material, which does not adhere firmly to the material of the insulator layer to be laminated in the module, can also be used as the sacrificial material. Suitable materials can be, for example, polyamide such as nylon, or a suitable silicon-coated material. The sacrificial-material piece 16 is attached with the aid of the adhesive layer 15.

After this, in the example of FIG. 2, on top of the conductor membrane 12 are laminated insulator membranes 11, in which holes 4 for the components 6 and sacrificial-material pieces 16 are made, as well as a unified insulator membrane 10, which is of an unhardened or pre-hardened polymer. During lamination, the insulator membranes 10, 11 melt together and form a unified insulator layer 1 around the components 6 and the pieces 16. In the embodiment of FIG. 2, the insulator membranes 11 are fibre mats impregnated with polymer, or membranes containing pre-hardened polymer and reinforced with fibre material. The polymer can be, for example, epoxy and the fibre reinforcement can be, for example, glass-fibre mat. A typical example of a suitable material for the insulator membrane 11 is a FR4-type, glass-fibre-reinforced epoxy membrane. Of course, other reinforcement and polymer-material combinations can be used. When using several insulator membranes 11, it is also possible for the membranes to differ from each other.

In FIGS. 2 and 3, the fibre material is shown by wavy lines 19. In the figures that come hereinafter, the fibre material 19 is not shown, but these structures too include a fibre material 19. The fibre material 19 contained in the insulator membrane 11 or insulator membranes 11 acts as a reinforcement, which provides mechanical strength for the electronics module being manufactured. According to the example of FIG. 2, holes 4 are made in the insulator membrane 11 at the positions of the components 6 and the sacrificial-material pieces 16. The insulator membranes 11 are perforated especially for the reason that holes can be made in the fibre material 19 contained in the insulator membranes 11 for the components 6 and the pieces 16. Without perforation, during lamination the components 6 and pieces 16 would press against the fibre-material layer 19. However, depending on the embodiment, the un-perforated insulator membrane 10 can be fibre reinforced or non-reinforced.

The insulator membranes 10, 11 are typically selected in such a way that they contain so much polymer able to flow that, in the lamination stage, the flowing polymer will be sufficient to fill the holes 4 made in the insulator membranes 11 around the components 6 and the sacrificial-material pieces 16. The structure shown in FIG. 3 will then be obtained, in which the insulator layer 1 contains a tight polymer layer, which contains one or more reinforcements of fibre material 19. The polymer layer binds tightly to the fibre material 19 while the tight polymer layer also attaches to the surfaces of the components 6, when a tight, unified, and mechanically strong insulator layer is formed, which contains at least one component 6, and which is, in addition, reinforced by fibre material 19.

In the example of FIG. 2, a unified insulator membrane 10 was used, but the insulator membrane 10 can also be omitted from the structure. In that case, the insulator membrane 11, or the insulator membranes 11 are selected in such a way that already in themselves they contain enough polymer able to flow to fill the holes 4 contained in the insulator membranes 11 around the components 6 and the pieces 16. Typically, the filling of the holes 4 is, however, easier to ensure by using a separate insulator membrane 10.

A conductor membrane 14, which is preferably of the same kind of and equally thick material as the conductor membrane 12, is also laminated to the structure together with the insulator membranes 10, 11. Thus, the insulator layer 1 and the components 6 will remain between the similar conductor membranes 12 and 14. Such an intermediate stage in the module manufacture is shown in FIG. 3. In the intermediate stage of FIG. 3, there is adhesive on the contact surfaces of the contact terminals 7 and typically also in the contact openings 8. In the stage shown in FIG. 4, this adhesive is removed and contact holes 18, which extend to the contact surfaces of the contact terminals 7, are formed at the positions of the contact openings 8.

It should be further stated with reference to FIG. 3 that the structure can also be manufactured in such a way that an unified layer of fibre material 19 runs between the components 6 and the conductor membrane 14. A structure of this kind can be used when the thickness of the components 6 is sufficiently smaller than that of the insulator layer 1. The structure can be manufactured, for example, in such a way that a unified insulator membrane 10, which contains a layer of fibre material 19, is laminated to the structure.

Figure 4:
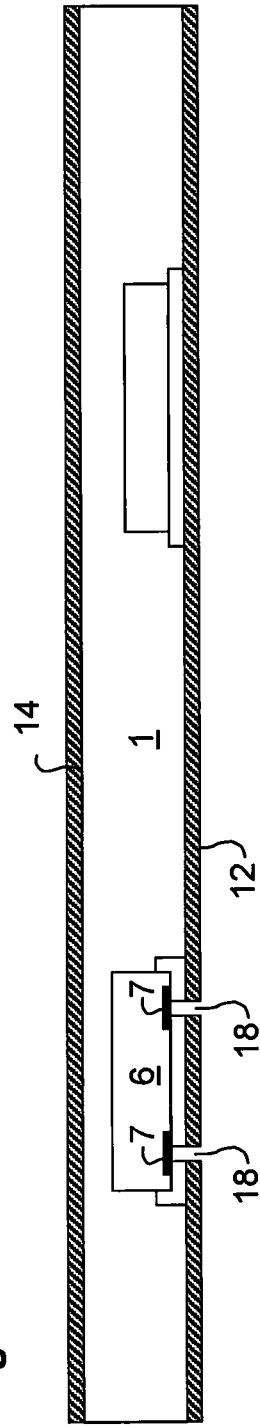
FIG. 4 shows a fourth intermediate stage in the manufacturing method according to a first embodiment.

If, in an embodiment, a support membrane is used on the surface of the conductor membrane 12, as described above in connection with the description of FIG. 1, it is best to remove the support membrane after lamination, i.e. between the intermediate stages shown by FIGS. 3 and 4.

After lamination and the removal of the possible support membrane, the adhesive layer that has arisen in the contact openings 8 and between the contact openings 8 and the contact terminals 7 is removed. In the embodiment of the figures, the removal of the adhesive is implemented by the laser ablation method, using a $CO_2$ laser, though it is, of course, possible to use other suitable methods. In the embodiment of the figure, a $CO_2$ laser is used, because a $CO_2$ laser's ability to vaporize an organic insulating substance, such as an epoxy-based adhesive, is good, whereas its ability to vaporize copper or other metals is poor. Thus, the conductor membrane 12 can be used as a mask for manufacturing the contact holes 18. Using this method, it is possible to make contact holes 18, the diameter of which is less than the diameter of a $CO_2$ laser's beam. This properties creates a significant advantage, as the minimum diameter of a $CO_2$ laser's beam is typically in the order of 75 µm, which is too large when considering the manufacture of precise electronics module structures. A UV laser, on the other hand, can typically be used to manufacture clearly more precise structures. The minimum diameter of the beam of a UV laser can be, for example, 25 µm, but a UV laser is not, however, suitable for removing adhesive from the contact openings 8 and from between the contact openings 8 and the contact terminals 7.

The use of a conductor-membrane mask thus permits the manufacture of very precisely delimited and precisely positioned contact holes 18 in an insulator material, such as the adhesive 5 used in the embodiment. In addition, the use of a $CO_2$ laser permits the contact surfaces of the contact terminals 7 to be cleaned in the same process stage, without a significant danger of the destruction of, or damage to the contact terminals 7. In the embodiment, the conductor membrane 12 is of copper and the contact terminals 7 of the component are also metal, so that they are not sensitive to the beam of a $CO_2$ laser and thus the process can be designed in such a way that the contact surfaces of the contact terminals 7 are sure to be cleaned sufficiently well. Thus the advantage of the method described is that the contact openings 8 can be made very precisely in the conductor membrane 12 with the aid of a UV laser and, after this, the contact openings 8 can be used as a mask for making the contact holes 18 use a less precise $CO_2$ laser, which is safer for the structure.

Figure 5:
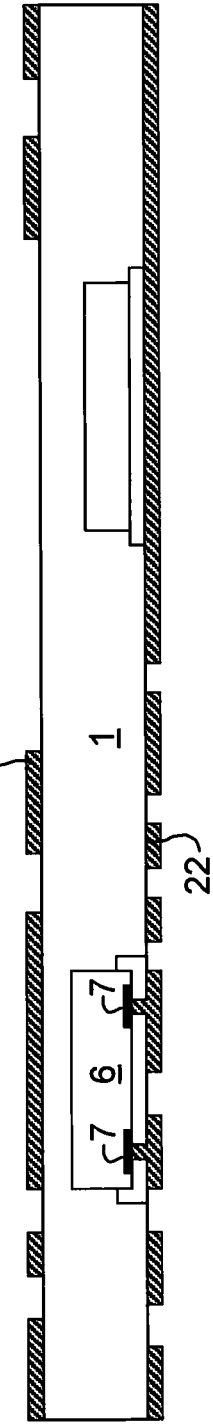
FIG. 5 shows a fifth intermediate stage in the manufacturing method according to a first embodiment.

In FIG. 5, conductor material, which connects the contact terminals 7 electrically to the conductor membrane 12, is made in the contact holes 18. In addition, the conductor membranes 12 and 14 are patterned for create conductor-pattern layers, which contain conductors 22 and 24. The patterning can be made, for example, using a conventional photolithography method.

The conductor material made in the contact holes 18 can be, for example, an electrically conductive paste. However, the conductor material is preferably a metal or metal allow in one or several layers.

In one embodiment, the conductor material is made in the contact holes 18 in such a way that first of all an intermediate layer is made using a suitable chemical conductor-material growing method (electroless plating). The intermediate layer can also consist of a layer of two or more different materials, which is made correspondingly using two or more methods. One purpose of the intermediate layer is to create a conductor membrane of the side walls of the contact holes 18, which connects the contact terminals 7 and the conductor membrane 12 to each other. Another purpose of the intermediate layer is to provide material accommodation between the material of the contact terminals 7 and the conductor patterns connecting them. Such material accommodation can be required, for example, in order to ensure the quality and durability of the mechanical or electrical contact, for example, if the material of the conductor-pattern layer of a circuit module is copper and the material of the contact terminals 7, 17 is some other than copper (Cu), for example aluminium (Al).

After the manufacture of the intermediate layer, in this embodiment manufacture is continued in an electrochemical bath. Additional conductor material, which forms a conductor core for the contact elements, is then grown in the contact holes 18. At the same time, the thickness of the conductor membranes can also be increased.

Figure 6:
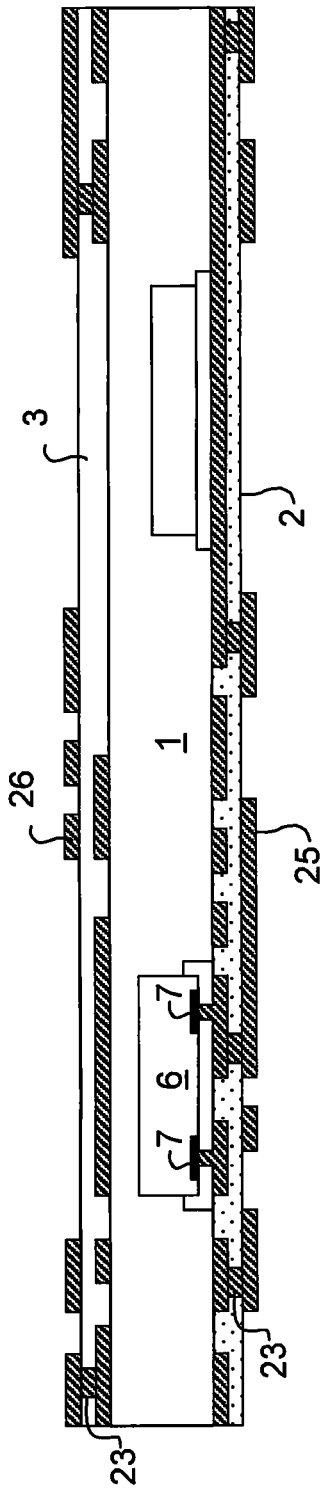
FIG. 6 shows a sixth intermediate stage in the manufacturing method according to a first embodiment.

After the intermediate stage shown in FIG. 5, a flexible layer 2 is spread on the surface of the side of the blank with the conductors 22 and an insulator layer 3 is spread on the side with the conductors 24. The layers 2 and 3 are shown in FIG. 6. The flexible layer 2 is manufactured from a flexible insulator material, for example from polyimide. In the case of polyimide, the flexible layer 2 can be made in such a way that a polyimide film, on the surface of which is an adhesion layer, is attached to the surface on the blank, on top of the conductors 22. The polyimide film is pressed against the surface of the blank in such a way that the adhesion layer attaches the polyimide film to the surface of the conductors 22 and the insulator layer 1 and, at the same time, at least partly fills the openings remaining in the gaps between the conductors 22. The material of the flexible layer 2 is selected in such a way that it is suitable for folding and preferably withstands folding several times. The flexible layer 2 should thus form the flexible membrane contained in the flexible zone 13 of the rigid-flex structure.

For its part, the insulator layer 3 can be manufactured, for example, from epoxy or some other suitable intermediate layer used in the circuit-board industry. Of course, the insulator layer 3 can also be made from the same material as the flexible layer 2. After this, vias 23 running through the flexible layer 2 and the insulator layer 3, as well as conductors 25 and 26, which form conductor-pattern layers on top of layer 2 and correspondingly insulator layer 3, are manufactured.

Figure 7:
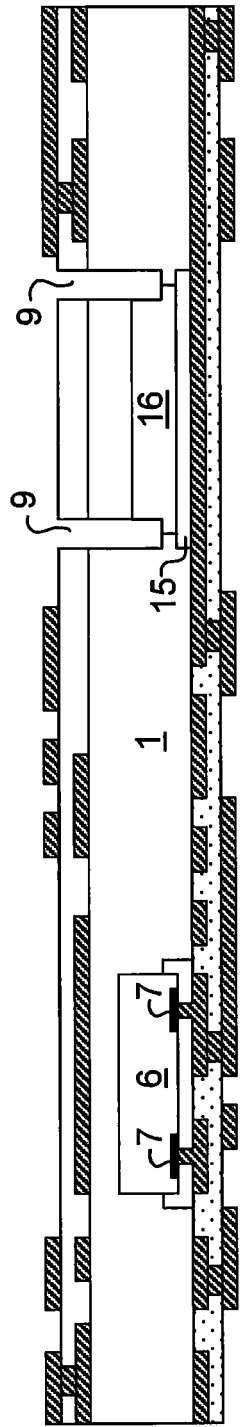
FIG. 7 shows a seventh intermediate stage in the manufacturing method according to a first embodiment.
Figure 8:
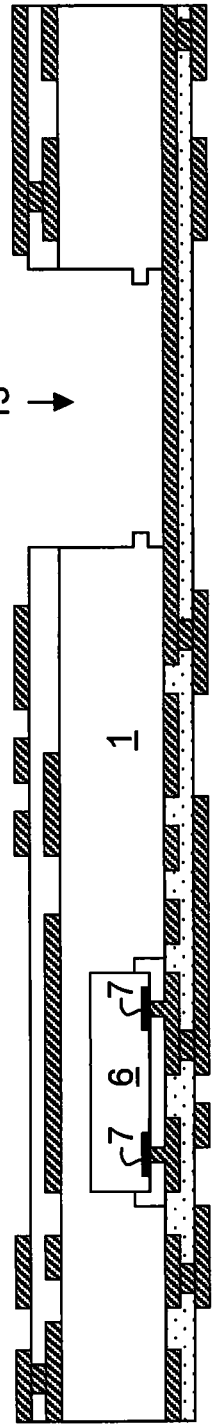
FIG. 8 shows an eighth intermediate stage, or one possible end product in the manufacturing method according to a first embodiment.

In the stage shown in FIG. 7, grooves 9, which extend to the sacrificial material 16, are milled in the blank. The adhesion of the sacrificial material 16 to the insulator layer 1 is poor while the adhesion and/or cohesion of the adhesive layer 15 has been weakened during the heat treatment contained in the lamination described in connection with FIG. 2. The adhesion can also be weakened with the aid of thermal, UV, and/or chemical treatment. The adhesion can thus be poor in nature and/or weakened with the aid of additional processing. For this reason, it is easy to remove from the blank the sacrificial-material piece 16 and the parts of the insulator layers 1 and 3 on its surface. After this, an electronics module or circuit board shown in FIG. 8 is obtained, which comprises at least one component 6 embedded in the insulator layer 1, as well as a flexible zone 13, in which the electronics module or circuit board can be folded.

FIGS. 9-15 show a manufacturing method according to a second embodiment. The technical features and parameters depicted in connection with the descriptions of FIGS. 1-8 can also be applied in the process stages shown in FIGS. 9-15, so that all the details of the manufacturing process and their benefits are not repeated in the following embodiments, in order to avoid unnecessary repetition. However, the following presents the essential differences between the embodiments shown in FIGS. 1-8 and FIGS. 9-15.

According to FIG. 9, in this embodiment too manufactured is started from a conductor membrane 12, in which contact openings 8 are made. This stage corresponds fully to the stage described in connection with FIG. 1.

Next, manufacture is continued largely in the manner described in connection with FIG. 2. This stage is shown in FIG. 10. Unlike the description in connection with FIG. 2, in the embodiment of FIG. 10 a flexible piece 20 is attached to the surface of the conductor membrane 12 and only on this surface is an adhesive layer 15 for the gluing of the sacrificial material and a sacrificial-material piece 16. The flexible piece 20 is a piece or strip made from a thin, flexible insulator membrane, which is cut or made slightly wider than the planned flexible zone 13, but, however, locally in the scale of the entire electronics module or circuit board being manufactured. The surface area of the flexible piece 20 is thus substantially smaller than the surface area of the electronics module or circuit board being manufactured. With the aid of such a method, flexible material is saved compared to the embodiment of FIGS. 1-8, as the volume of the flexible piece 20 is significantly smaller than the volume of the flexible layer 2.

The saving in flexible material is financially significant when using, for example, polyimide as the flexible material, as this is clearly more expensive than, for example, epoxy-based materials, which can be used, for example, when making the insulator layer 1. Like the flexible layer 2, the flexible piece 20 can thus also be made from a flexible insulator material, for example from polyimide. In the case of polyimide, the flexible piece 20 can be glued to the surface of the conductor membrane 12 using a separate adhesive, or a polyimide film, on the surface of which is an adhesion layer, can be used as the flexible piece 20. In the embodiments, the flexible piece 20 can also be replaced by a flexible material to be spread in a fluid form, which hardens or is hardened to form the flexible piece 20 only when the rigid-flex structure is being manufactured.

Figure 11:
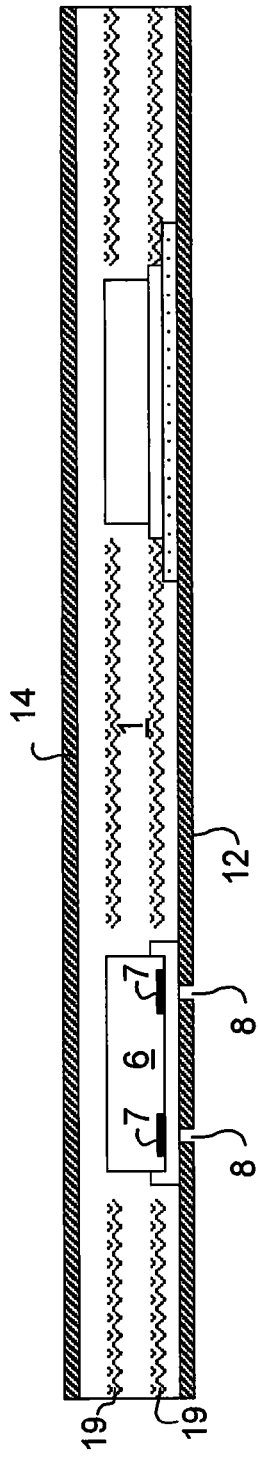
FIG. 11 shows a third intermediate stage in the manufacturing method according to a second embodiment.

As in the manner described in connection with FIG. 2, the component 6 and the piece 16 of sacrificial material are also attached to the conductor membrane 12. After this, in the example of FIG. 10, an insulator membrane 11, in which holes 4 for the components 6 and sacrificial-material pieces 16 are made, as well as a unified insulator membrane 10, which is of an un-hardened or pre-hardened polymer, are laminated on top of the conductor membrane 12. During the lamination, the insulator membranes 10, 11 melt together and form a unified insulator layer 1 around the components 6 and pieces 16. A conductor membrane 14 is also laminated to the structure together with the insulator membranes 10, 11. FIG. 11 shows the structure after these intermediate stages.

Figure 12:
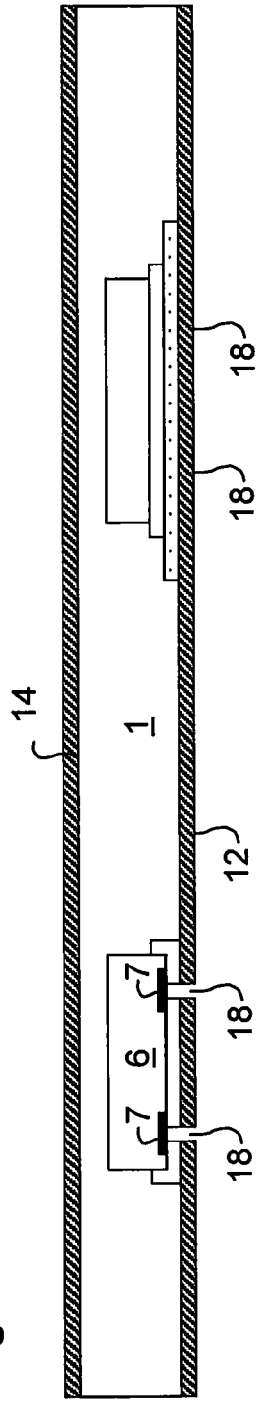
FIG. 12 shows a fourth intermediate stage in the manufacturing method according to a second embodiment.

In the stage shown in FIG. 12, material that has come on top of the contact openings 8 and the contact terminals 7 is removed and contact holes 18, which extend to the contact surfaces of the contact terminals 7, are formed at the location of the contact openings 8. This can be done, for example, with the aid of a $CO_2$ laser.

Figure 13:
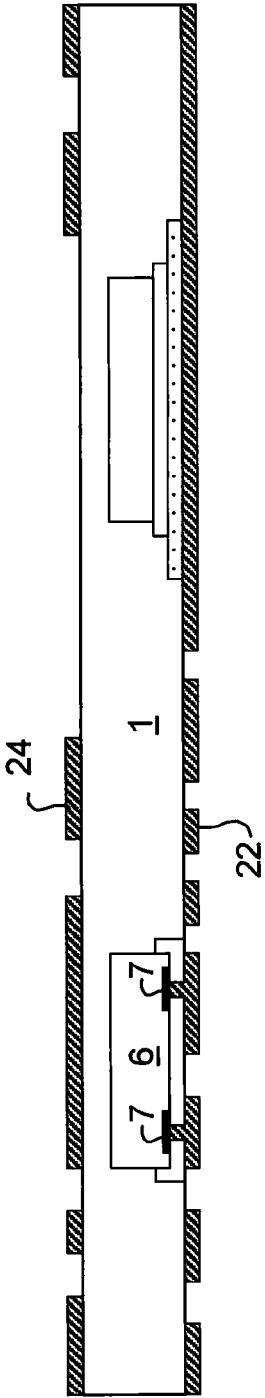
FIG. 13 shows a fifth intermediate stage in the manufacturing method according to a second embodiment.

In FIG. 13, conductor material, which connects the contact terminals 7 electrically to the conductor membrane 12, is made in the contact holes 18. In addition, the conductor membranes 12 and 14 are pattern to form conductor-pattern layers, which contain conductors 22 and 24. The patterning can be made, for example, using a conventional photolithography method.

Figure 14:
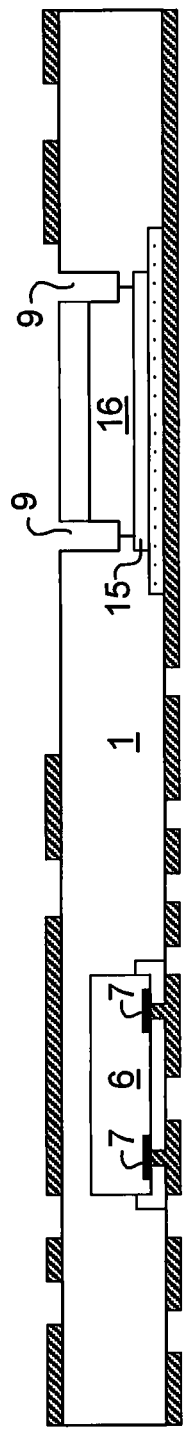
FIG. 14 shows a sixth intermediate stage in the manufacturing method according to a second embodiment.
Figure 15:
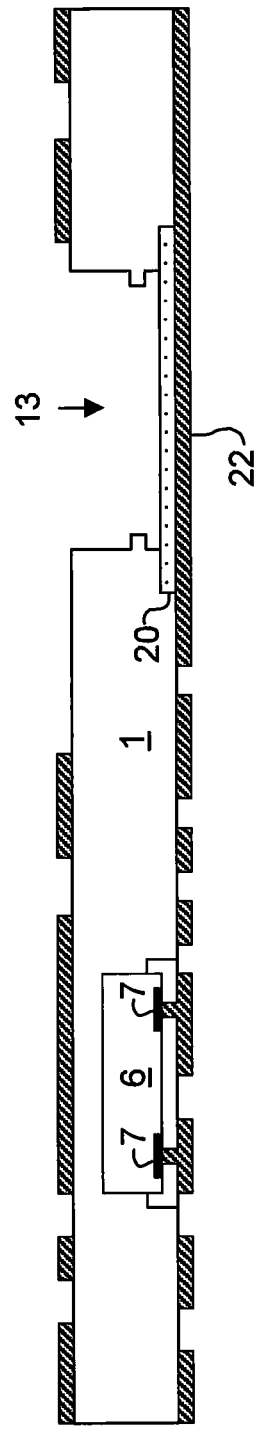
FIG. 15 shows a seventh intermediate stage, or one possible end product in the manufacturing method according to a second embodiment.

In the stage shown in FIG. 14, grooves 9, which extend to the sacrificial material 16, are milled in the blank. The adhesion of the sacrificial material 16 to the insulator layer 1 is poor while the adhesion and/or cohesion of the adhesive layer 15 has be weakened during the heat treatment performed in the stage shown in FIG. 10. The adhesion can also be weakened with the aid of heat, UV, and/or chemical treatment performed for this purpose. The poor adhesion of the sacrificial material 16 and/or the weakened adhesion of the adhesive layer 15 can thus be the result of the materials' properties and/or of additional processing. For this reason, the sacrificial-material piece 16 and the part of the insulator layer 1 on its surface can be easily removed from the blank. After this, the electronics module or circuit board shown in FIG. 15 is obtained, which comprises at least one component 6 embedded inside an insulator layer 1, and a flexible zone 13, in which the electronics module or circuit board can be folded. In this embodiment, the flexible zone 13 comprises a flexible support membrane, which forms part of the flexible piece 20, as well as conductors 22 running on the surface of this support membrane, which connect the part of the module or circuit board on different sides of the flexible zone 13 to each other electrically.

With the aid of the method of FIGS. 9-15, it is thus possible to manufacture economically also such circuit boards containing a flexible zone (rigid-flex boards), which comprise two conductor-pattern layers. In the method, the number of conductor patterns can, however, equally well be increased, for example, in such a way that the desired number of alternating insulator and conductor layers can be added to the surfaces of the blank between the stages shown in FIGS. 13 and 14. Of course, with the aid of the methods described above it is also possible to manufacture a structure, which contains only a single conductor-pattern layer (conductors 22).

FIGS. 16-22 show a manufacturing method according to a third embodiment. The technical features and parameters depicted in connection with the descriptions of FIGS. 1-8 and 9-15 can also be applied in the process stages shown in FIGS. 16-22, so that all the details of the manufacturing process and their benefits are not repeated in the following embodiments, in order to avoid unnecessary repetition. However, the following presents the essential differences between the embodiments shown in FIGS. 9-15 and FIGS. 16-22.

Figure 16:
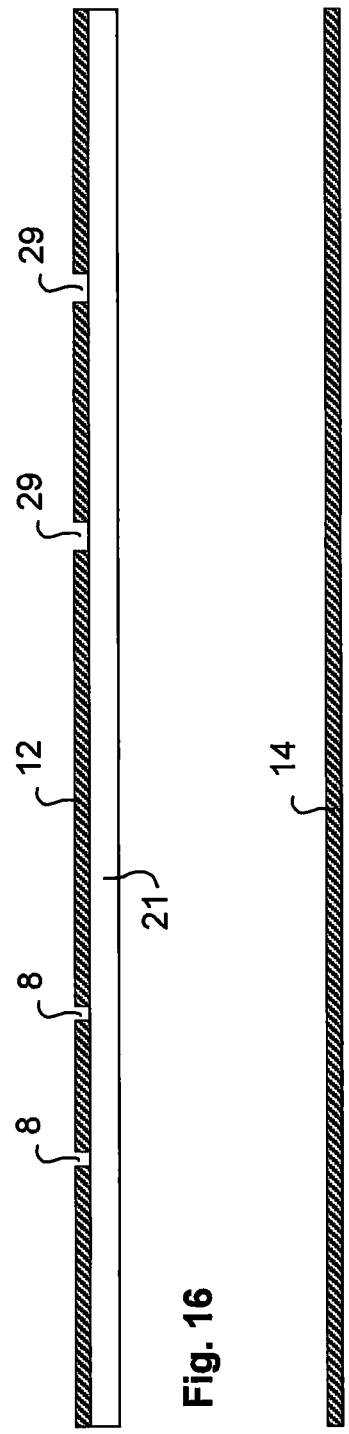
FIG. 16 shows one intermediate stage in the manufacturing method according to a third embodiment.

According to FIG. 16, in this embodiment too manufacture is started from a conductor membrane 12, which is supported with the aid of a support membrane 21. The support membrane 21 can be, for example, metal. For example, a copper film can be used as the support membrane 21. Contact openings 8 are made in the conductor membrane 12 at the locations of the contact terminals 7 of the components 6. In addition, a groove 29, which runs round the flexible zone 13 to be manufactured, is made in the conductor membrane 16.

Figure 17:
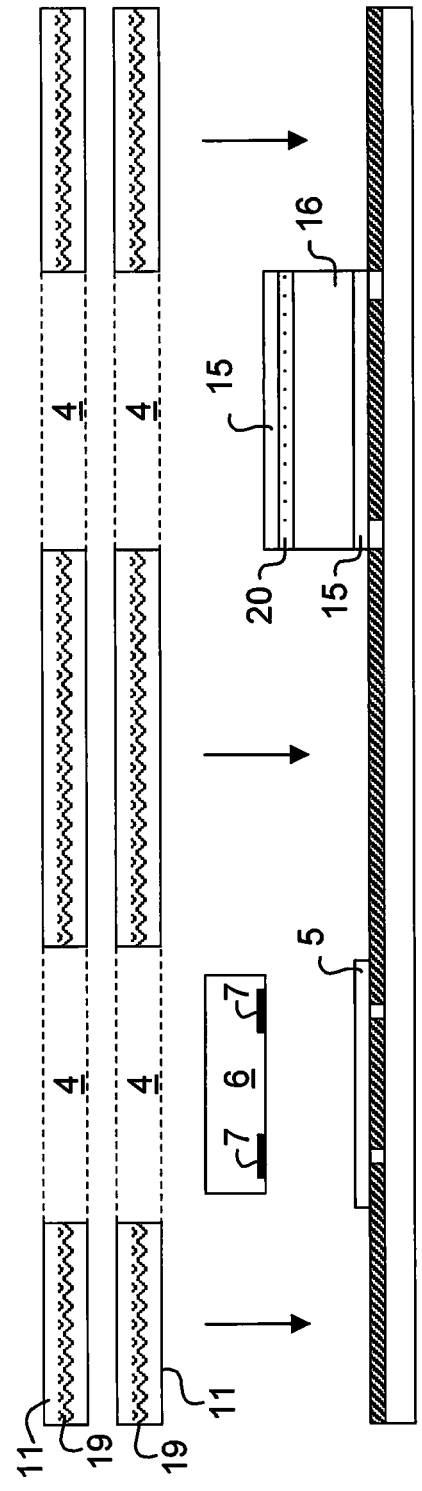
FIG. 17 shows a second intermediate stage in the manufacturing method according to a third embodiment.

Next, manufacture is continued largely in the manner described in connection with FIG. 10. This stage is shown in FIG. 17. Unlike the description of FIG. 10, in the embodiment of FIG. 17 a layered structure or layers are attached to the surface of the conductor membrane 12 in the flexible zone 13 in one or more stages, in such a way that a layered structure is formed, in which there is a sacrificial-material piece 16 on the surface of the adhesive layer 15 and a flexible piece 20 on the surface of the sacrificial-material piece 16. In addition, the layered structure can comprise one or more insulator layers on the surface of the flexible piece 20. In the example of the figure, there is a new adhesive layer 15 on the surface of the flexible piece 20.

Figure 18:
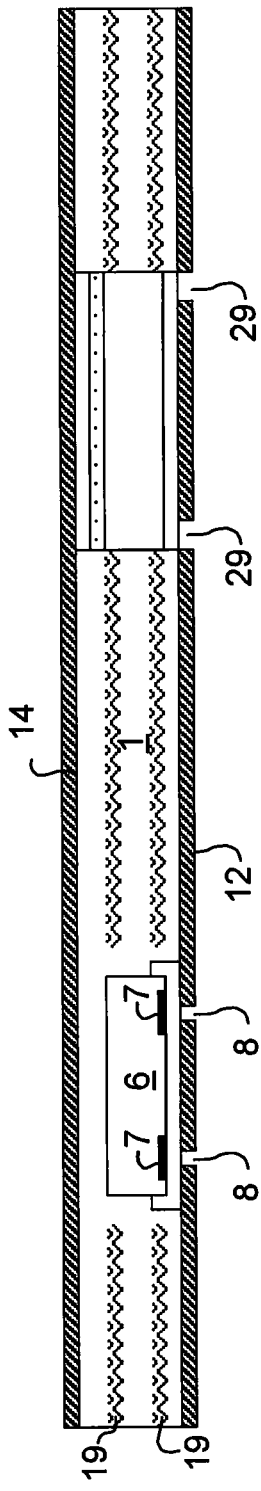
FIG. 18 shows a third intermediate stage in the manufacturing method according to a third embodiment.
Figure 19:
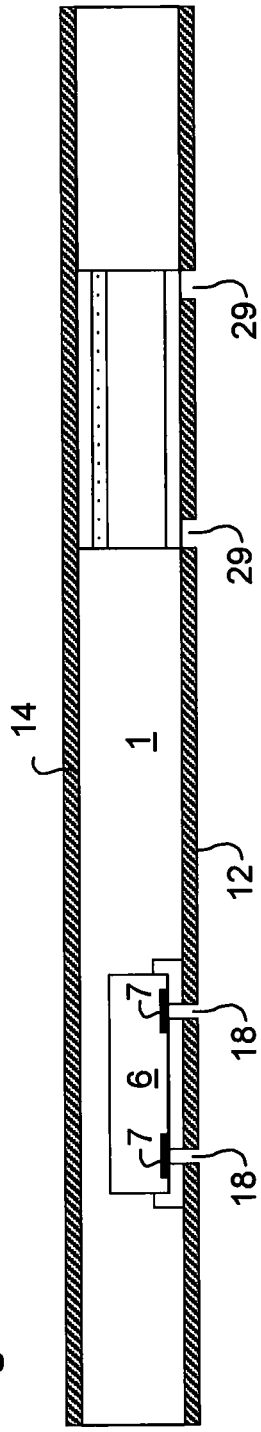
FIG. 19 shows a fourth intermediate stage in the manufacturing method according to a third embodiment.
Figure 20:
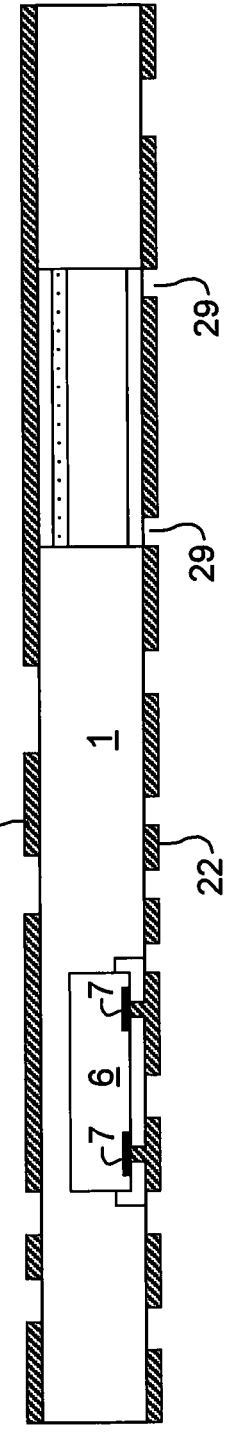
FIG. 20 shows a fifth intermediate stage in the manufacturing method according to a third embodiment.

The removal of the support membrane 21 is best performed after lamination, i.e. between the stages shown in FIGS. 17 and 18. The stages shown in FIGS. 18-20 correspond fully to the method stages shown in FIGS. 11-13. However, in the stage of FIG. 20, it is possible to make allowance for the groove 29 in connection with the manufacture of the conductor pattern and simultaneously remove conductor material that may have grown in the groove 29.

This embodiment of FIGS. 16-22 can also be modified in such a way that, in the stage shown in FIG. 16, no groove 29 at all is made, but instead this groove 29 is made using a photolithography method only in the patterning stage of the conductor pattern. In a second modification, the groove 29 is made already in the stage shown in FIG. 16, but the manufacture of the conductor pattern is performed only after the stage shown in FIG. 22 and described later.

Figure 21:
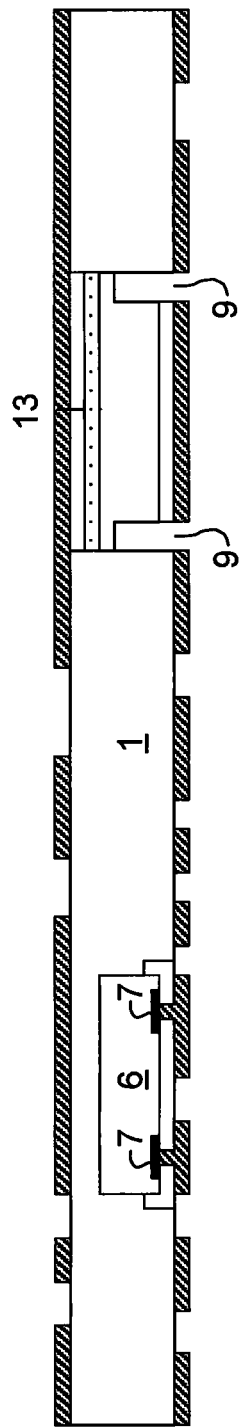
FIG. 21 shows a sixth intermediate stage in the manufacturing method according to a third embodiment.
Figure 22:
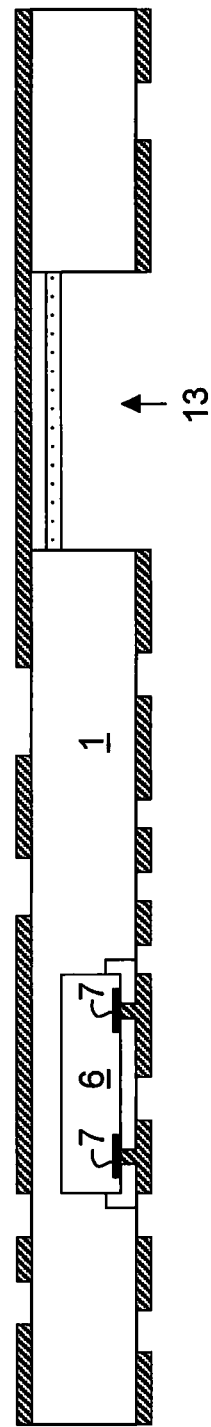
FIG. 22 shows a seventh intermediate stage, or one possible end product in the manufacturing method according to a third embodiment.

In the stage shown in FIG. 21, grooves 9, which extend to the sacrificial material 16 are made in the blank. The grooves 9 can be made through the grooves 29, in which case the grooves 9 can be aligned with the aid of the grooves 29. The grooves 9 can then also be manufactured using the grooves 29 as a mask delimiting the conductor material. For example, a $CO_2$ laser is very suitable for this purpose. Otherwise, the stages shown in FIGS. 21 and 22 correspond to the method stages in FIGS. 14 and 15.

FIGS. 23-32 show a manufacturing method according to a fourth embodiment. The technical features and parameters depicted in connection with the descriptions of FIGS. 1-22 can also be applied in the process stages shown in FIGS. 23-32, so that all the details of the manufacturing process and their benefits are not repeated in the following embodiments, in order to avoid unnecessary repetition. However, the following presents the essential differences between the embodiments shown in FIGS. 16-22 and FIGS. 23-32.

In the method, the layered structure shown in FIGS. 23 and 24 is manufactured. FIG. 23 shows a schematic cross-section of the layered structure in the thickness direction. According to FIG. 23, the layered structure comprises a first sacrificial-material piece 30, on the surface of which are the first flexible conductors 31. On top of the first flexible conductors 31 there is, in turn, a flexible piece 20 and, on top of this, further second flexible conductors 32. On the surface of the second flexible conductors 32, there is, in turn, a second sacrificial-material piece 33.

For its part, FIG. 24 shows the layered structure of FIG. 23 as a cross-section in the direction of the plane defined by the first flexible conductors 31. It can be seen from the cross-section of FIG. 24 that the first flexible conductors 31 between the two opposite ends of the layered structure and, in addition, contact bases 33 are shaped in the ends of the conductors 31. The material remaining between the conductors 31 is, depending on the embodiment, either material from the sacrificial-material piece 30, material from the flexible piece 20, other insulator material added between these, air, or gas. The material remaining between the conductors 31 can also be any combination whatever of the materials described above. The second flexible conductors 32 of the layered structure can be designed in a corresponding manner to the first flexible conductors 31.

The stage of FIG. 26 corresponds to the stage of FIG. 16, but, in addition, in the stage of FIG. 26 it is possible to manufacture contact openings 34 for vias at the locations of the future vias. In the stage of FIG. 25, a corresponding counter-piece is manufactured. If components are not attached directly to the counter-piece, contact openings 8, as shown in the figure, need not be manufactured. An adhesive layer 15 also may not necessarily need to be spread on the surface of the counter-piece, but it is, of course, possible to also spread an adhesive layer 15.

Figures 27, 28:
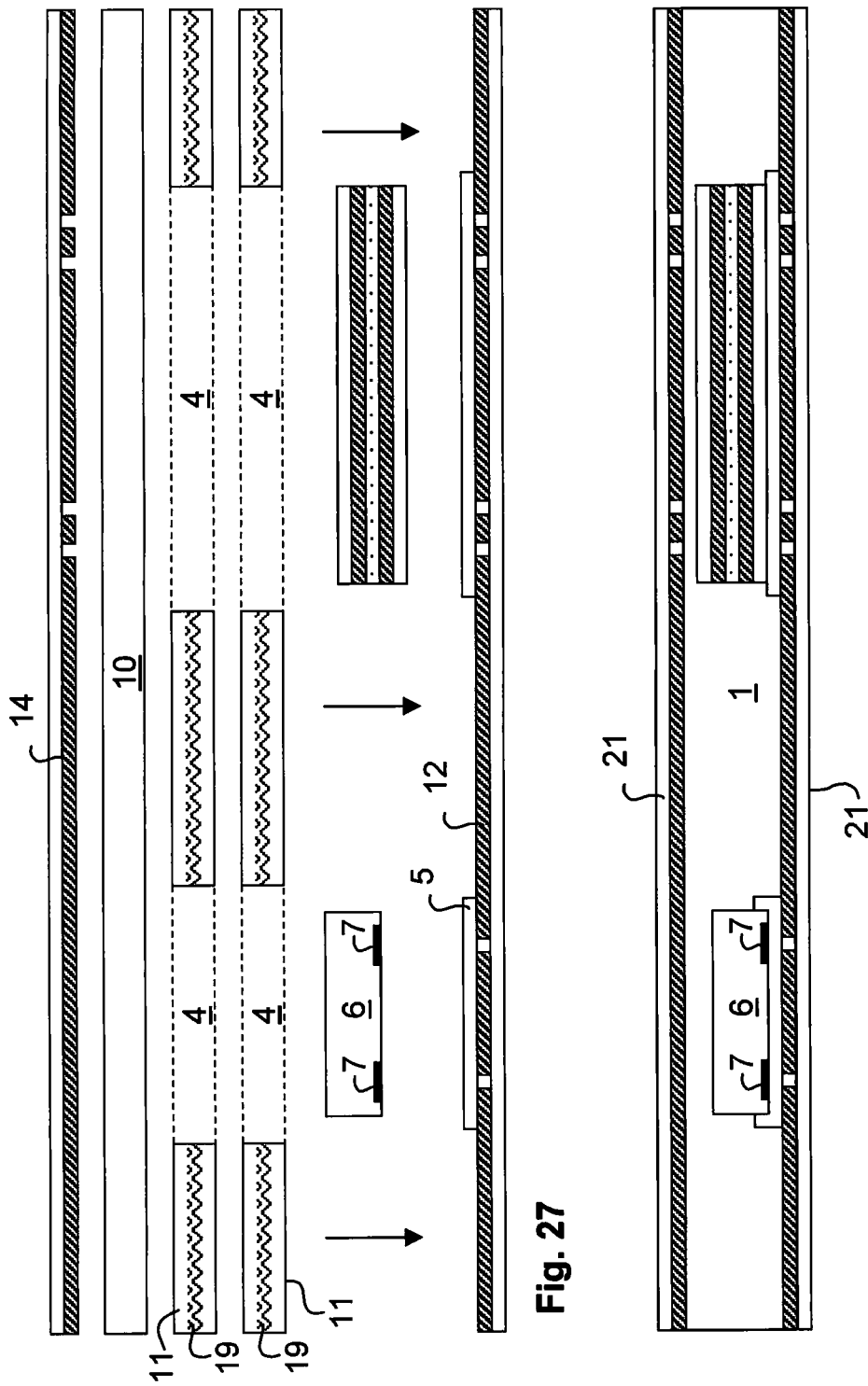
FIG. 27 shows an intermediate stage in the manufacturing method according to a fourth embodiment, in which the flex piece of FIG. 23 and the membrane structures of FIGS. 25 and 26 are joined together.
FIG. 28 shows a second intermediate stage in the manufacturing method according to a fourth embodiment.

In the stage of FIG. 27, the structures shown in FIGS. 23-26 are laminated together in a manner corresponding to that shown in connection with FIGS. 10 and 17.

FIG. 28 shows the laminated structure while FIG. 29 shows the structure after the removal of the support membranes 21.

In the stage shown in FIG. 30, contact holes 35 for vias are manufactured through the contact openings 34 of the vias. In this stage, grooves (not shown) corresponding to the grooves 9 shown in FIG. 21 are also manufactured and a substantial part of the first and second sacrificial-material pieces 30 and 33 is removed. The contact holes 18 are opened through the contact openings 8.

Figure 31:
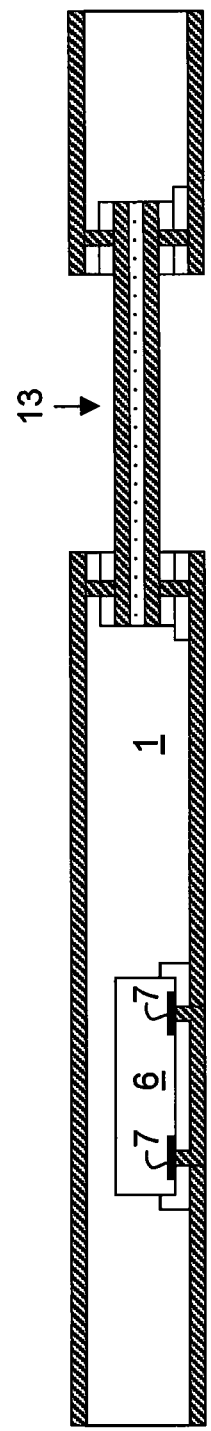
FIG. 31 shows a fifth intermediate stage in the manufacturing method according to a fourth embodiment.
Figure 32:
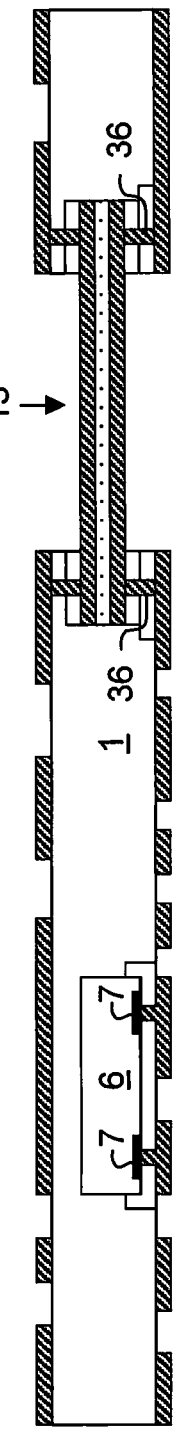
FIG. 32 shows a sixth intermediate stage, or one possible end product in the manufacturing method according to a fourth embodiment.

Next, in the stages shown in FIGS. 31 and 32, the blank is metallized and patterning is performed in the manner of the previous embodiments. In connection with metallization, conductor material is also grown in the contact holes 35 of the vias and in this way a via 36 is made that connects the first flexible conductors 31 to the conductor membrane 12 and the second flexible conductors 32 to the second conductor 14. There is reason to protect the flexible zone 13 with a protective material during metallization and patterning. A second alternative is to remove the sacrificial-material pieces 30 and 33 only after metallizing or patterning.

The number of conductor-pattern layers is not limited in any of the embodiments shown in FIGS. 1-32, it being possible in all of them to manufacture the desired number of insulator and conductor-pattern layers on a surface or surfaces of the structure.

In the methods described above, one excellent feature is that the manufacturing method permits components to be embedded inside the structure and the flexible zone to be manufactured in such a way that these features cause very few additional manufacturing stages in the manufacturing method. The methods can thus be used to manufacture such modules and circuit boards very efficiently, so that at the same time even significant cost savings can be expected.

In the embodiments described above, a component is embedded inside a circuit board, but the embedding of the component is not, however, necessary. Thus, a circuit board containing a flexible zone can be manufactured according to the examples described above, even without an embedded component or components.

Layered structures, for example stacked component packages, can also be manufactured from electronics modules made according to the methods described above. FIGS. 33-35 show one example of such methods.

FIG. 33 shows an electronics module, which comprises, among other things, two embedded components 6, for example memory circuits, as well as a flexible zone 13. According to FIG. 34, the electronics module is folded at the flexible zone 13 to form an overlapping structure. According to FIG. 35, components 27 can, if desired, be attached to one surface of this structure using the surface-mounting method, while solder balls 28 or other corresponding contact elements are made on the other surface.

Figure 36:
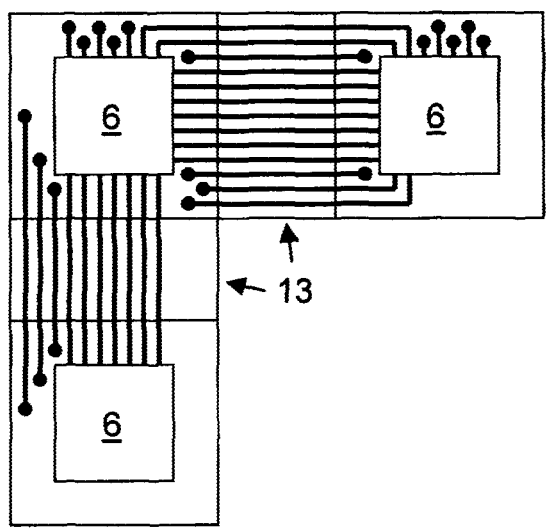
FIG. 36 shows one intermediate stage in the method according to the fourth embodiment, by means of which a package is manufactured, for example, from the product depicted in FIG. 8 or 15.
Figure 37:
FIG. 37 shows one possible end product in the method according to the fourth embodiment.

In the manner of FIGS. 36 and 37, an electronics module can also be manufactured in such a way that several parts, for example three, four, or five parts, of the electronics module, are folded to form an overlapping structure with the aid of flexible zones 13. FIG. 36 shows a schematic diagram of one such structure in a flat form while in FIG. 37 the structure of FIG. 36 is folded, with the 'wings' folded on top of the central part. The black lines extending over the zones 13 shown in FIG. 36 depict conductors, which connect the components 6 to form an operational totality. Some of the lines end in a black ball, which depict vias to another conductor-pattern layer.

With the aid of the embodiments, it is possible to achieve a relatively short manufacturing process for multi-layer packages. For example, there are four conductor layers in the multi-layer package of FIG. 34, but the manufacture of all four conductor layers requires only a single conductor-pattern manufacturing stage and a single component attaching stage. Without a flex portion, the manufacture of the conductor patterns of the package would require at least 2 separate and consecutive conductor-pattern manufacturing stages and two separate component attaching stages.

Thus, the embodiments present a method for manufacturing a rigid-flex-type circuit board, in which method the following method stages are performed:
1. A conductor membrane 12 is taken, which has a first and a second side, and manufacture is started. The conductor membrane 12 can be purely of conductor material, for example copper, or it can consist of two or more layers, part of which can also be an insulating material, as has already been described above.
2. A flexible membrane is attached to the conductor membrane 12 in such a way that it covers at least the flexible zone 13, i.e. the flex part of the circuit board. When manufacturing the flexible membrane, it is possible to exploit, for example, the flexible layer 2 or flexible piece 20 described above. The flexible membrane can be attached to the first or the second side of the conductor membrane 12.
3. A sacrificial-material piece 16 is attached to the conductor membrane 12 on the first side of the conductor membrane 12, at the location of the flexible zone 13.
4. An insulator layer 1, which covers the conductor membrane essentially over the entire surface area of the circuit board and encloses the sacrificial-material piece 16 within it, is manufactured on the first side of the conductor membrane 12. In this case, the term surface area of the circuit board refers to the surface area of the circuit board that is the end product. The production panel being processed in the actual manufacturing process can comprise several circuit boards. In a typical embodiment, the insulator layer 1 covers the surface area of the circuit board entirely while generally the insulator layer 1 covers also the entire production panel. However, there can be local holes or openings in the insulator layer 1.
5. An opening 9, which extends to the sacrificial-material piece 16, is made in the insulator layer 1 from the direction of the first side of the conductor membrane 12. The opening can be made, for example, by milling.
6. The sacrificial-material piece 16 is removed, thus making the flexible zone 13 flexible.
7. Conductors 22 are manufactured by patterning the conductor membrane 12 after the manufacture of the insulator layer 1.

The order of performing the method stages described above can vary in many ways.

One possibility is to perform the method stages in numerical order. A second example is to perform the stages in the order 1, 2, 3, 4, 7, 5, and 6. A third example is the order 1, 3, 4, 7, 2, 5, and 6. It is also possible to use many other performance sequences. It is also possible for stage 1 to be performed only later, in which case the structure can be supported during the first of the stages to be performed with the aid of, for example, the insulator membrane or a separate support surface, instead of the conductor membrane 12. It is also possible for the structure to be supported with the aid of the insulator membrane or a separate support surface when stage 7 is performed already before stage 4.

In one embodiment, at least one component 6 is placed inside the insulator layer 1. This can be performed in such a way that the component 6 is attached to the conductor membrane 12 on the first side of the conductor membrane 12, before the manufacture of the insulator layer 1 and, in a suitable stage after this, electrical contacts are manufactured between the contact terminals 7 of the component 6 and the conductors 22. Of course, these stages too can be planned to be performed at some other point in the manufacturing method. In addition, it is possible to proceed in such a way that the conductor membrane 12 is patterned before the attached of the component, in which case the component 6 will be attached to the conductor-pattern layer formed by the conductors 22.

In one embodiment, before the component 6 is attached to the conductor membrane 12 (or to the conductors 22), contact openings 8 are made for the manufacture of contact elements. The component 6 is attached in such a way that the contact terminals 7 are located to correspond to the contact openings 8 and contact elements, which connect the contact terminals 7 electrically to the conductor membrane 12, are made through these contact openings 8. The contact elements are preferably manufactured using a chemical and/or electrochemical growing method.

With the aid of such manufacturing methods, it is possible to manufacture, for example, a rigid-flex electronics module, which comprises
    a layer of conductors 22,
    at least one flexible zone 13 (flex), which comprises a flexible membrane 2 or 20 and over which at least some of the conductors 22 run, supported by the flexible membrane 2 or 20,
    an insulator layer 1 (rigid), which supports the conductors 22 above the flexible zone 13,
    at least one component 6 inside the insulator layer 1, on the surface of which component there are contact terminals 7 and which is positioned in such a way that the contact terminals 7 face towards the conductors 22, and
    contact elements in order to form a conductive connection between the contact terminals 7 and the conductors 22, which contact elements are unified metal pieces, which consist of one or more metal layers, each of which is manufactured by growing using a chemical or electrochemical method.

In an embodiment, in which it is wished to save flexible material, the flexible membrane can be locally implemented in such a way that it extends from each edge of the flexible zone 13 only a short distance inside the insulator layer 1, between the insulator layer 1 and the conductors 22. Such a short overlapping is advantageous, because in that case the flexible membrane will adhere to the insulator layer 1 and the structure will be more durable. In this connection, the suitable short distance depends, of course, on the application, but the suitable short distance can be, for example, at most 2 cm and generally less than 1 cm.

In one embodiment, the contact elements comprise a copper core manufactured by an electrochemical growing method, which is bounded in the direction of the side walls and the component 6 by an intermediate layer, and which in the direction of the conductor 22 connects unbrokenly, i.e. without an interface, to the material of the conductor 22. One example of such a structure is a structure, in which the conductive material of the copper core of the contact element and part of the conductor 22 is manufactured in the same process, so that the parts connect solidly together and there is no interface between them.

Usually in embodiments the aim is for the height of the contact element to be less than, or equal to the greatest width of the contact element.

There are also embodiments of the electronics module, in which the insulator layer 1 contains at least one layer of fibre material 19, in which fibre material 19 there is an openings for a component 6, as well as a unified polymer layer, which is attached to the fibre material 19 and the component 6.

The manufacturing methods described above and their sub-processes can be modified in many ways. For example, the use of an actual adhesive to attach the component to the conductor membrane 12 can be replaced with some other adhesion mechanism. One example that can be given is the use of an insulator layer with an adhesion property on the surface of the conductor membrane 12. In that case, the components 6 are pressed directly against the insulator layer, so that the components are correspondingly held sufficiently in place, as described in connection with the embodiment using adhesive. Such an insulator layer can contain, for example, a tape-like coating, or can consist of a polymer or similar material with a plastic surface part.

The method can also be implemented without the use of an adhesive 5 or an adhesion property. In that case, the components 6 can be held in place, for example, mechanically of with the aid of a vacuum. The vacuum or similar temporary attachment can then be maintained until the component 6 is sufficiently held in place with the aid of the insulator material 1.

The component 6 to be attached can be, for example, an integrated circuit, such as a memory chip, processor, or ASIC. The component to be attached can also be, for example, a MEMS, LED, or passive component. The component to be attached can be encased or without a casing and its contact terminals 7 can consist of contact areas, contact bumps, or similar. The can also be a thinner conductor coating than actual contact bumps of the surface of the contact areas of the component.

The method can also be adapted in such a way that an adhesive layer 15 is spread only on the surface of the sacrificial material, inside of the conductor layer. Another alternative is to spread an adhesive layer 15 on the surface of both the sacrificial material and the conductor layer or other substrate used. A third alternative is to manufacture the sacrificial material beforehand to be part of a piece that comprises an adhesive layer 15 or a corresponding adhesion layer.

The material of the insulator layer 1 too can be selected differently from the examples described above. The insulator layer 1 can be manufactured from a suitable polymer, or a material containing polymer. The manufacturing material of the insulator layer 1 can be, for example, in a fluid or pre-hardened form (such as prepreg). For example, a glass-fibre reinforced epoxy sheet, such as an FR4 or FR5-type sheet, can be used in the manufacture of the insulator layer 1. Other examples of materials that can be used in the manufacture of the insulator layer 1 are PI (polyimide), aramide, polytetrafluoroethylene, and Teflon®. Instead of, or as well as thermosetting plastics, it is also possible to utilize thermoplastics, for example some suitable LCP (liquid crystal polymer) material in the manufacture of the insulator layer 1.

Further, it is possible to proceed in such a way that the component 6 and the sacrificial-material piece 16 are attached to the already patterned layer formed by the conductors 22, instead of to the conductor membrane 12. In such a method, it is natural to support the conductors 22 using a support membrane, as is shown in FIG. 26. It is also possible to use the layer formed by the already patterned conductors 24 instead of the conduction membrane 14.

The connection between the component 6 and the conductors 22 can also be manufactured in a different way. For example, the component 6 can be joined to the conductors 22 or conductor membrane 12 in such a way that an electrical contact is formed already in the joining. In that case, the opening of the contact openings 8 and contact holes 18 can be omitted, nor is there also any need to fill the contact holes 18. For example, the component can be glued to the conductors 22 or conductor membrane 12 with the aid of a conductive adhesive. If the conductive adhesive is an anisotropically conductive adhesive, it can be spread as described in the embodiments disclosed above. If an isotropically conductive adhesive is used, the adhesive can, for example, be dosed locally onto the surfaces of the contact terminals 7 of the component.

Other possible methods for manufacturing an electrical contract between the component 6 and the conductors 22 or conductor membrane 12 are, for example, thermo-compression methods, the ultrasonic bonding method, and soldering.

In addition, it will be obvious to one skilled in the art that the features of the invention described above can be used as part of a larger totality, for example in such a way that an electronics module is manufactured using partly methods according to the prior art and partly using embodiments of the invention described here. It is also possible to manufacture additional circuit-board layers on, or also attach components, for example using the surface-mounting technique to the surface or surfaces of the electronics-module structures described above.

The examples disclosed above depict some possible methods and structures, with the aid of which our invention can be exploited. However, our invention is not restricted solely to the examples and embodiments disclosed above, but instead the invention also covers numerous other methods and structures, taking into account the full scope and equivalence interpretation of the Claims.

The invention claimed is:

1. A rigid-flex electronics module, which comprises
at least one flexible zone, which comprises a flexible membrane and conductors, which run over the flexible zone supported by the flexible membrane,
outside the flexible zone and attached thereto an insulator layer, which has a first and a second surface,
a layer of conductors on the first surface of the insulator layer,
inside the insulator layer, at least one component having contact terminals and a layer of adhesive on a first surface, the component being positioned in such a way that the first surface with the contact terminals face towards the conductors on the first surface of the insulator layer and the layer of adhesive is between the first surface of the component and the conductors, and contact elements for creating a conductive connection between the contact terminals and the conductors on the first surface of the insulator layer through the layer of adhesive, which contact elements are unified metal pieces, which consist of one or more metal layers, each of which is manufactured by growing using a chemical or electrochemical method, wherein the flexible zone is folded and wherein the layer of conductors on the first surface of the insulator layer is electronically connected to at least one other layer of conductors through the conductors of the flexible zone.

2. The electronics module according to claim 1, in which the insulator layer contains at least one layer of a fibre material, in which fibre material there is an opening for a component, as well as a unified polymer layer, which is attached to the fibre material and the component.

3. The electronics module according to claim 1, which comprises a polymer layer between the conductors and the component, in which polymer layer there are contact holes for the contact elements, and in which the contact elements fill the contact holes entirely.

4. The electronics module according to claim 3, in which the polymer layer is local, in such a way that it is present essentially only in the location of the component.

5. The electronics module according to claim 1, which comprises a second layer of conductors on the second surface of the insulator layer.

6. The electronics module according to claim 1, in which the conductors of the flexible zone are of one and the same conductor-pattern layer as the conductors on the first surface of the insulator layer.

7. The electronics module according to claim 5, in which the conductors of the flexible zone are of one and the same conductor-pattern layer as the conductors on the second surface of the insulator layer.

8. The electronics module according to claim 1, in which the conductors of the flexible zone form at least one separate conductor-pattern layer, which extends inside the insulator layer between the first and second surfaces of the insulator layer and the electronics module comprises vias for connecting the conductors of the flexible zone electrically to at least one conductor on the surface of the insulator layer.

9. A rigid-flex electronic module, comprising an insulator layer having a first surface and a second surface;

at least one rigid zone and at least one flexible zone adjacent to the at least one rigid zone defined in the electronic module, the at least one flexible zone having a higher flexibility than the at least one rigid zone and the electronic module comprising a flexible membrane extending at least over the flexible zone;

a layer of conductors running on the first surface of the insulator layer, a first portion of the layer of conductors being in the at least one rigid zone and a second portion of the layer of conductors extending further over the flexible zone, the flexible membrane supporting said second portion of the layer of conductors ;

at least one component having on a first surface a layer of adhesive and contact terminals, the at least one component located inside the insulator layer such that the contact terminals face towards the conductors on the first surface of the insulator layer and the layer of adhesive is between the contact terminals and the conductors; and contact elements between the contact terminals and the conductors on the first surface of the insulator layer, the contact elements being unified metal pieces formed by at least one layer of metal grown by at least one of: a chemical growing method and an electrochemical growing method, wherein the first portion of the layer of conductors is connected to at least one other layer of conductors through the second portion of the layer of conductors, and wherein the flexible zone is folded.

10. The electronics module according to claim 1, wherein the electronics module is folded at the flexible zone.

* * * * *